United States Patent
Wang

(10) Patent No.: US 6,936,930 B2
(45) Date of Patent: Aug. 30, 2005

(54) THERMAL ENHANCE MCM PACKAGE

(75) Inventor: Sung-Fei Wang, Kaohsiung (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 0 days.

(21) Appl. No.: 10/747,038

(22) Filed: Dec. 30, 2003

(65) Prior Publication Data

US 2004/0150116 A1 Aug. 5, 2004

(30) Foreign Application Priority Data

Dec. 30, 2002 (TW) .................................... 91137928 A

(51) Int. Cl.[7] .............................................. H01I 23/48
(52) U.S. Cl. ...................................... 257/778; 257/678
(58) Field of Search ................................ 257/777, 688, 257/678, 778, 780

(56) References Cited

U.S. PATENT DOCUMENTS 6,204,562 B1 * 3/2001 Ho et al. ..................... 257/777
6,236,109 B1 * 5/2001 Hsuan et al. ................ 257/688
6,696,321 B2 * 2/2004 Joshi .......................... 438/111

* cited by examiner

*Primary Examiner*—Howard Weiss
*Assistant Examiner*—(Vikki) Hoa B. Trinh
(74) *Attorney, Agent, or Firm*—Bacon & Thomas, PLLC

(57) ABSTRACT

A thermal enhance multi-chips module package mainly comprises an assembly substrate, a first assembly package, a second assembly package, a heat dissipation board, and a thermally conductive metal ring. The first assembly package and the second assembly package are disposed on the upper surface and the lower surface of the assembly substrate respectively; and the thermally conductive metal ring is disposed at the periphery of the upper surface of the heat dissipation board and encompasses the second assembly package. The second assembly package has a logic chip therein and generates a lot of heat, and the heat dissipation board can transmit the heat to the outside through the thermally conductive metal ring so as to prevent the excessive heat from transmitting to the motherboard and accumulating in the motherboard. Accordingly, the motherboard can be avoided damaging.

18 Claims, 1 Drawing Sheet

THERMAL ENHANCE MCM PACKAGE

BACKGROUND OF THE INVENTION

1. Field of Invention

This invention relates to a thermal enhance multi-chips module (MCM) package. More particularly, the present invention is related to a thermal enhance MCM package characterized in that the heat generated from the chips can be prevented from being directly transmitted to the motherboard.

2. Related Art

Recently, integrated circuit (chip) packaging technology is becoming a limiting factor for the development in packaged integrated circuits of higher performance. Semiconductor package designers are struggling to keep pace with the increase in pin count, size limitations, low profile, and other evolving requirements for packaging and mounting integrated circuits.

Due to the assembly package in miniature and the integrated circuits operation in high frequency, MCM (multi-chips module) packages are commonly used in said assembly packages and electronic devices. Usually, said MCM packages mainly comprise at least two chips encapsulated therein, for example a processor unit, a memory unit and related logic units, so as to upgrade the electrical performance of said assembly package. In addition, the electrical paths between the chips in said MCM package are short so as to reduce the signal delay and save the reading and writing time.

Generally speaking, conventional MCM packages shall be a multi-chips side-by-side packages or a multi-chips stacked packages with a logic chip and a memory chip therein. As shown in FIG. 1, it illustrates a multi-chips package comprising an assembly substrate 10, a first assembly package 12 and a second assembly package 14. In general, the first assembly package 12 comprises memory chips therein and the second assembly package 14 has logic chips therein. Therein, the first assembly package 12 and the second assembly package 14 are electrically connected to the motherboard 17 through solder balls 16. The second assembly package 14 comprises logic chips 14 having high I/O pins and high power so as to generate a lot of heat. When the whole MCM package is disposed on the motherboard 17, the second assembly package 14 is adjacent to the motherboard 17 or secured to the motherboard 17 via a thermally conductive adhesive 19. Accordingly, the heat generated from the chips 12 and 14 will be easily transmitted to the motherboard 17 and accumulated in the motherboard 17 so as to cause the other electronics mounted on the motherboard to be damaged.

Therefore, providing another assembly package to solve the mentioned-above disadvantages is the most important task in this invention.

SUMMARY OF THE INVENTION

In view of the above-mentioned problems, an objective of this invention is to provide a MCM package to upgrade the thermal performance of the electronic devices embedded in said package or mounted on the motherboard due to prevent excessive heat from transmitting to the motherboard and accumulating in the motherboard.

To achieve the above-mentioned objective, a thermal enhance MCM package is provided, wherein said package mainly comprises an assembly substrate, a first assembly package, a second assembly package, a heat dissipation board, and a thermally conductive ring. The first assembly package and the second assembly package are disposed on the upper surface and the lower surface respectively; the thermally conductive ring is disposed at the periphery of the heat dissipation board and encompasses the second assembly package.

As mentioned above, the excessive heat generated from the logic chips disposed in said second assembly package is transmitted to the thermally conductive ring on the heat transmission board and the outside so as to prevent excessive heat from being directly transmitted to the motherboard and causing the other electronic devices to be damaged.

BRIEF DESCRIPTION OF THE DRAWINGS

The invention will become more fully understood from the detailed description given herein below illustrations only, and thus are not limitative of the present invention, and wherein.

DETAILED DESCRIPTION OF THE INVENTION

The thermal enhance MCM package according to the preferred embodiment of this invention will be described herein below with reference to the accompanying drawings, wherein the same reference numbers refer to the same elements.

Figure 1:
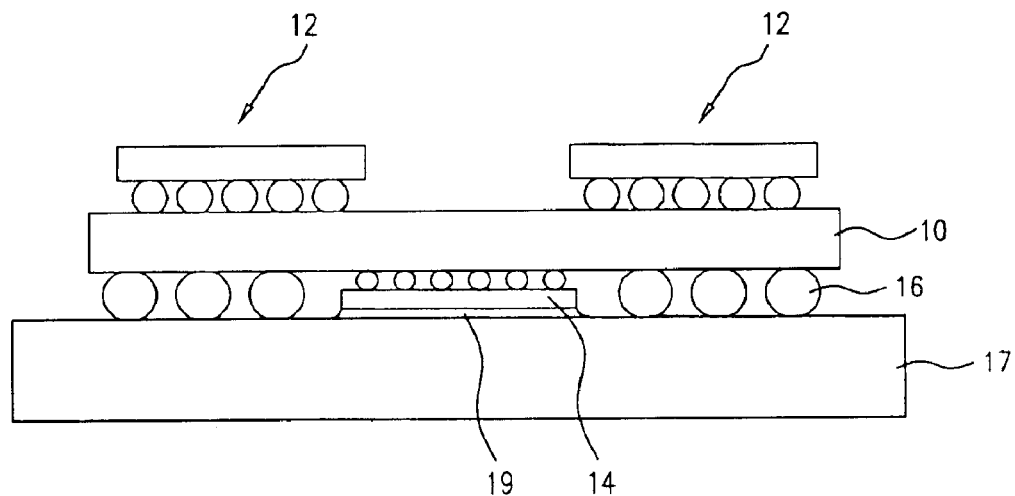
FIG. 1 is a cross-sectional view of the conventional multi-chips module (MCM) package.
Figure 2:
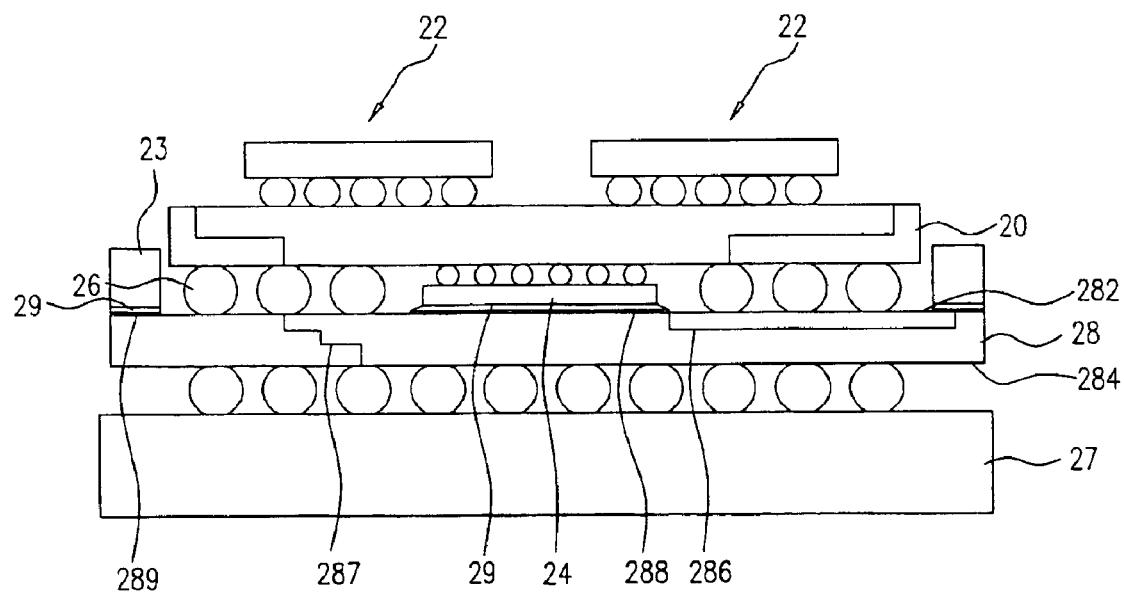
FIG. 2 is a cross-sectional view of a thermal enhance multi-chips module (MCM) package.

In accordance with a first preferred embodiment as shown in FIG. 2, there is provided a thermal enhance MCM package. Said thermal enhance MCM package mainly comprises a first assembly package 22, a second assembly package 24, a heat dissipation board 28, and a thermally conductive ring 23. The above-mentioned assembly substrate 20 is disposed above the heat dissipation board 28 and connects the second assembly package 24 and the heat dissipation board 28. Therein, a thermally conductive epoxy 29 is disposed between the bottom of the second assembly package 24 and the upper surface of the heat dissipation board 28. Similarly, the thermally conductive epoxy 29 is disposed between the upper surface of the heat dissipation board 28 and the thermally conductive ring 23 is disposed. In such a manner, the second assembly package 24, and the thermally conductive ring 23 are secured to the heat dissipation board 28 and to cause the heat generated from the second assemble package 24 to transmit to the heat dissipation board 28 and the thermally conductive ring 23 more quickly. Consequently, it can avoid excessive heat transmitting to the motherboard 27.

As mentioned above, the heat dissipation board 28 at least comprises a thermally conductive circuit layer 286 and an electrically conductive circuit layer 287. Referring again to FIG. 2, the thermal enhance MCM package 2 further comprises a first electrically conductive bump 26, the first electrically conductive bump 26 being electrically connected to one of the electrically conductive circuit layers 287. Therein, the upper surface of the heat dissipation board 28 exposes a portion of the thermally conductive circuit 286 to form a first thermally conductive pad 288 and a second thermally conductive pad 289, wherein the first thermally conductive pad 288 and the second thermally conductive pad 289 are connected to the bottom of the second assembly 24 and the thermally conductive ring 23 respectively. Accordingly, most of the heat generated from the second assembly package 24 can almost be transmitted to the outside so the motherboard 27 can be prevented from being damaged due to more and more heat accumulating in the motherboard 27.

Generally speaking, the heat dissipation board 28 may be an organic substrate made of a core layer, and insulation layers and circuit layers interlaced with each other. The material of the insulation layer can be selected from Bismaleimide-Triazine (BT), glass epoxy resins (FR4) and polyimide (PT). Circuit layers be formed by the method of disposing a copper layer on the insulation layer, forming a patterned photoresist on the copper layer and then patterning the copper layer by the patterned photoresist. Therein, a portion of the circuit layers are taken as thermally conductive layer 286 for transmitting heat only without carrying electrical signals; and a portion of the circuit layers are taken as electrically conductive layer 287 for transmitting the electrical signals from the first assembly package 22 and the second assembly package 24 to the motherboard 27 through the assembly substrate 20, the first electrically conductive bump 26, and the heat dissipation board 28.

The first thermally conductive pad 288 and the second thermally conductive pad 289 are formed by exposing the thermally conductive layers 286 out of the upper surface of the heat dissipation board 28. However, the thermally conductive layers 286 are copper layers. Accordingly, the thermally conductive layers are easily oxidized so as to lower the thermal performance of said package when the thermally conductive epoxy is cured. Thus, a metal layer, for example a silver layer and a nickel layer, and a black oxide layer are formed on the first thermally conductive pad 288 and the second thermally conductive pad 289 to prevent said pads from being oxidized.

Besides, the thermally conductive ring 23 is disposed at the periphery of the upper surface of the heat dissipation board 20 and surrounds the second assembly package 24. In such a manner, there are more dissipation areas for dissipating heat so as to upgrade the heat convection performance and transmit excessive heat to the outside. In addition, the thermally conductive ring 23 is made of copper metal or aluminum metal so as to upgrade the thermal performance. Similarly, disposing another thermally conductive body at the periphery of the heat dissipation board 28 can also upgrade the thermal performance of said MCM package. For example, a metal film with an opening is disposed on the heat dissipation board so as to have the second assembly package disposed in the opening.

Usually, the first assembly package 22 is an assembly package memory chips therein, and the second assembly package 24 is an assembly package with logic chips having high I/O pins and generating a lot heat. Accordingly, the heat generated from the logic chip will be redistributed and transmitted to the outside through the heat dissipation board 28 so as to reduce the heat to be accumulated in the motherboard 27.

Although the invention has been described in considerable detail with reference to certain preferred embodiments, it will be appreciated and understood that various changes and modifications may be made without departing from the spirit and scope of the invention as defined in the appended claims.

What is claimed is:

1. A thermal enhance multi-chips module package, comprising:

an assembly substrate having a first upper surface and a first lower surface;

a first assembly package disposed on the first upper surface and electrically connected to the first upper surface;

a second assembly package disposed on the first lower surface and electrically connected to the first lower surface;

a heat dissipation board having a second upper surface and a second lower surface wherein the heat dissipation board has a plurality of circuit layers and a plurality of insulation layers interlaced with the circuit layers, and said circuit layers include electrically conductive circuit layers and thermally conductive circuit layers connected to a bottom of the second assembly package, and wherein a first thermal pad and a second thermal pad are formed on the second upper surface of the heat dissipation board and are connected with each other through one of the thermally conductive circuit layers.

2. The thermal enhance multi-chips module package of claim 1, further comprising a thermally conductive body disposed on the second upper surface and connected to one of the thermally conductive circuit layers.

3. The thermal enhance multi-chips module package of claim 1, further comprising a first electrically conductive bump formed on the firs lower surface and electrically connected to one of the electrically conductive circuit layers.

4. The thermal enhance multi-chips module package of claim 1, wherein the first thermal pad is connected to the second assembly package.

5. The thermal enhance multi-chips module package of claim 2, wherein the second thermal pad is connected to the thermally conductive body.

6. The thermal enhance multi-chips module package of claim 4, wherein a thermally conductive adhesive is interposed between the first thermal pad and the second assembly package.

7. The thermal enhance multi-chips module package of claim 4, wherein a thermally conductive adhesive is interposed between the second thermal pad and the thermally conductive body.

8. The thermal enhance multi-chips module package of claim 1, wherein a thermally conductive body is disposed at the periphery of the second upper surface.

9. The thermal enhance multi-chips module package of claim 1, wherein a thermally conductive body is a metal ring surrounding the second assembly package.

10. The thermal enhance multi-chips module package of claim 1, wherein a thermally conductive body is a metal film with an opening for accommodating the second assembly package.

11. The thermal enhance multi-chips module package of claim 1, wherein a thermally conductive body is made of copper metal.

12. The thermal enhance multi-chips module package of claim 1, wherein a thermally conductive body is made of aluminum metal.

13. The thermal enhance multi-chips module package of claim 1, wherein the first thermal pad is formed by exposing a portion of the thermally conductive circuit layer out of the second upper surface of the heat dissipation board.

14. The thermal enhance multi-chips module package of claim 1, wherein the second thermal pad is formed by exposing a portion of the thermally conductive circuit layer out of the second upper surface of the heat dissipation board.

15. The thermal enhance multi-chips module package of claim 1, further comprising a metal layer formed on the first thermal pad.

16. The thermal enhance multi-chips module package of claim 15, wherein the metal layer is a silver metal layer.

17. The thermal enhance multi-chips module package of claim 15, wherein the metal layer is a nicker metal layer.

18. The thermal enhance multi-chips module package of claim 1, wherein the circuit layers are made of copper metal.

* * * * *